United States Patent
Yamauchi (10) Patent No.: US 10,395,753 B2
(45) Date of Patent: *Aug. 27, 2019

(54) SEMICONDUCTOR MEMORY DEVICE AND PROGRAMMING METHOD THEREOF

(71) Applicant: Winbond Electronics Corp., Taichung (TW)

(72) Inventor: Kazuki Yamauchi, Saitama (JP)

(73) Assignee: Winbond Electronics Corp., Taichung (TW)

( * ) Notice: Subject to any disclaimer, the term of this patent is extended or adjusted under 35 U.S.C. 154(b) by 114 days.

This patent is subject to a terminal disclaimer.

(21) Appl. No.: 14/470,948

(22) Filed: Aug. 28, 2014

(65) Prior Publication Data

US 2016/0062827 A1 Mar. 3, 2016

(51) Int. Cl.
*G11C 29/52* (2006.01)
*G11C 16/34* (2006.01)
(Continued)

(52) U.S. Cl.
CPC .......... *G11C 29/52* (2013.01); *G06F 11/1048* (2013.01); *G11C 16/3459* (2013.01);
(Continued)

(58) Field of Classification Search
CPC ..... G11C 29/52; G11C 11/5628; G11C 16/10; G06F 11/10; G06F 11/1068;
(Continued)

(56) References Cited

U.S. PATENT DOCUMENTS 5,805,504 A * 9/1998 Fujita ............... G11C 7/1072
365/189.05
6,154,866 A * 11/2000 Kawahara ........ G11B 20/10527
360/32
(Continued)

FOREIGN PATENT DOCUMENTS

CN 1389872 1/2003
CN 101777024 7/2010
(Continued)

OTHER PUBLICATIONS

"Office Action of Taiwan Counterpart Application", dated Oct. 19, 2015, p. 1-p. 3, in which the listed references were cited.
(Continued)

*Primary Examiner* — April Y Blair
*Assistant Examiner* — Sazzad Hossain
(74) *Attorney, Agent, or Firm* — JCIPRNET (57) ABSTRACT

A semiconductor memory device is provided to keep data reliability while decreasing programming time. A NAND flash memory loads programming data from an external input/output terminal to a page buffer/sense circuit. A detecting circuit for monitoring the programming data detects whether the programming data is a specific bit string. If it is detected that the programming data is not a specific bit string, a transferring/writing circuit transfers the programming data kept by the page buffer/sense circuit to an error checking correction (ECC) circuit, and an ECC code generated by an ECC operation is written to the page buffer/sense circuit. If it is detected that the programming data is a specific bit string, transfer of the programming data kept by the page buffer/sense circuit is forbidden and a known ECC code corresponding to the specific bit string is written to the page buffer/sense circuit.

14 Claims, 7 Drawing Sheets

(51) Int. Cl.
*G11C 29/42* (2006.01)
*G11C 29/44* (2006.01)
*G06F 11/10* (2006.01)
G06F 3/06 (2006.01)
G11C 16/10 (2006.01)
G06F 11/00 (2006.01)
G11C 11/56 (2006.01)
G11C 29/04 (2006.01)

(52) U.S. Cl.
CPC .............. *G11C 29/42* (2013.01); *G11C 29/44* (2013.01); *G06F 3/0679* (2013.01); *G06F 3/0688* (2013.01); *G06F 11/00* (2013.01); *G06F 11/10* (2013.01); *G06F 11/1052* (2013.01); *G06F 11/1068* (2013.01); *G06F 2212/2022* (2013.01); *G06F 2212/214* (2013.01); *G06F 2212/222* (2013.01); *G06F 2212/403* (2013.01); *G11C 11/5628* (2013.01); *G11C 16/10* (2013.01); *G11C 2029/0409* (2013.01); *G11C 2029/0411* (2013.01)

(58) Field of Classification Search
CPC .... G06F 3/0679; G06F 11/00; G06F 11/1052; G06F 2212/2022; G06F 2212/214; G06F 2212/222; G06F 2212/403; G06F 3/0688
USPC .................................. 714/763, 764, 766, 773
See application file for complete search history.

(56) References Cited

U.S. PATENT DOCUMENTS

| | | | |
|---|---|---|---|
| 8,145,961 | B2 | 3/2012 | Arnez et al. |
| 8,156,402 | B2 | 4/2012 | Kohler et al. |
| 8,332,731 | B1 | 12/2012 | Sforzin et al. |
| 2004/0255225 | A1 | 12/2004 | Takai |
| 2008/0184094 | A1* | 7/2008 | Murray ............... G06F 11/1072 714/763 |
| 2008/0282135 | A1* | 11/2008 | Santou ...................... G06F 7/74 714/801 |
| 2009/0296478 | A1* | 12/2009 | Kim .................... G11C 11/5628 365/185.18 |
| 2009/0319871 | A1* | 12/2009 | Shirai ................. G06F 11/1068 714/773 |
| 2011/0238903 | A1 | 9/2011 | Ban |
| 2012/0195144 | A1* | 8/2012 | Ide .......................... G11C 29/40 365/200 |
| 2013/0227374 | A1 | 8/2013 | Desireddi |
| 2014/0104947 | A1 | 4/2014 | Yamauchi et al. |
| 2015/0081952 | A1* | 3/2015 | D'Abreu ............. G06F 12/0246 711/103 |
| 2015/0113342 | A1* | 4/2015 | Jung ....................... G11C 8/14 714/721 |
| 2015/0363128 | A1* | 12/2015 | Funaya ................... G06F 3/061 711/114 |

FOREIGN PATENT DOCUMENTS

| | | |
|---|---|---|
| CN | 102890645 | 1/2013 |
| JP | 2008-165805 | 7/2008 |
| JP | 2010-79486 | 4/2010 |
| JP | 2010-152989 | 7/2010 |
| KR | 100813630 | 3/2008 |
| KR | 20080093295 | 10/2008 |
| TW | I222078 | 10/2004 |
| TW | 200907993 | 2/2009 |

OTHER PUBLICATIONS

"Office Action of Korean Counterpart Application", dated Jun. 30, 2015, with English translation thereof, p. 1-p. 9, in which the listed references were cited.
"Office Action of China Counterpart Application", dated Oct. 22, 2018, p. 1-p. 7.

* cited by examiner

SEMICONDUCTOR MEMORY DEVICE AND PROGRAMMING METHOD THEREOF

BACKGROUND OF THE INVENTION

Field of the Invention

The invention relates to a semiconductor memory device and a programming method thereof, and to error checking and correction of input/output data of the semiconductor memory device. More particularly, the invention relates to error checking and correction of input data of a NAND flash memory.

Description of Related Art

The degree of integration of semiconductor memories such as flash memory, dynamic random access memory (DRAM) and so on is increasing year by year, thus making it difficult to manufacture a memory element free of failure or defect. Accordingly, with respect to a memory chip, a redundancy scheme for remedying a physical defect in appearance of the memory element caused during a manufacturing process is adopted. For example, in a certain redundancy scheme, the memory element having a physical defect is remedied by disposing a redundant memory. Moreover, in a semiconductor memory, in addition to the physical remedy by the redundant memory, an error checking correction (ECC) circuit is used as a soft error countermeasure.

In a NAND flash memory, due to repeated programming or erasure of data, a charge keeping characteristic deteriorates as a result of degradation of a tunnel insulating film, or threshold variation occurs due to a charge trapped by the tunnel insulating film, leading to a bit error. Patent Document 1 discloses loading an ECC circuit as such soft error countermeasure. Especially in a memory cell close to a block selecting transistor, there is a trend of increasing bit error rate as a result of uneven patterns caused by lithography or uneven ion implantation during formation of a diffusion layer. Thus, an ECC code is stored for remedying more of such bit errors.

Moreover, among NAND flash memories, there are not only NAND flash memories in which one memory cell stores 1-bit data, but also NAND flash memories in which one memory cell stores multi-bit data. Patent Document 2 discloses an error correction scheme for such multi-bit data. Further, Patent Document 3 discloses a flash memory as follows. An error checking correction (ECC) parity is added to inputted data to generate an ECC code, and the generated ECC code is written to a physical block. When there is an error in page data read from the physical block, the ECC code is utilized to correct the error. The physical block having a number of corrected errors equal to or greater than a threshold is registered in a table as a warning block. During data writing, the priority of the warning block for selection is lowered.

PRIOR-ART DOCUMENTS

Patent Documents

[Patent Document 1] Japan Patent Publication No. 2010-152989

[Patent Document 2] Japan Patent Publication No. 2008-165805

[Patent Document 3] Japan Patent Publication No. 2010-79486

SUMMARY OF THE INVENTION

In a NAND flash memory equipped on-chip with an ECC circuit, inputted data is kept by a page buffer, the data kept by the page buffer is transferred to the ECC circuit, and an ECC code (error code) generated by an ECC operation in the ECC circuit is written back to the page buffer. Then, the data of the page buffer is programmed in a selected page of a memory array. However, if all the programmed page data is subjected to the ECC operation, such process is extremely time-consuming. In the NAND flash memory, programming is performed in units of pages. Therefore, along with the higher degree of integration, a number of bits of each page increases, and time for the ECC circuit to perform an operation accordingly increases in proportion thereto. Such situation may become an obstruction in reducing the programming time.

The invention is to solve the above problem of the prior art by providing a semiconductor memory device that realizes reduction in programming time while keeping data reliability, and a programming method thereof.

The semiconductor memory device of the invention includes: a memory array; a data keeping element, keeping data read from the memory array or keeping data written to the memory array; an error checking correction (ECC) element, performing error checking and correction of data; a transferring element, transferring data from the data keeping element to the ECC element; a writing element, writing an ECC code generated by the ECC element to the data keeping element; and a detecting element, detecting whether data inputted to the data keeping element has a specific bit string, wherein when a specific bit string is detected, the transferring element forbids transfer of data corresponding to the specific bit string, and the writing element writes a predetermined ECC code to the data keeping element.

The specific bit string is a bit string including a logic 0 or a bit string including a logic 1. The specific bit string has a number of bits equal to that transferred simultaneously by the transferring element. The data keeping element is divided into a plurality of sectors. The transferring element transfers the data in units of sectors, and the ECC element performs an error checking and correction process in units of sectors. The number of bits of the specific bit string is equal to a number of bits of a page kept by the data keeping element. The semiconductor memory device further includes a memory element storing a relationship between the specific bit string and the ECC code. Moreover, the writing element writes the ECC code for the specific bit string based on a detection result of the detecting element. The writing element includes a logic circuit generating the ECC code for the specific bit string based on the detection result of the detecting element, and writes the ECC code generated by the logic circuit. The semiconductor memory device includes a plurality of external input/output terminals. Data inputted from the plurality of external input/output terminals are loaded in parallel to the data keeping element, and the detecting element detects whether the data inputted in parallel contains the specific bit string. The detecting element includes a detecting circuit detecting whether there is any migration of bit data.

The programming method of the NAND flash memory of the invention includes the following steps. Programming data inputted from an external input/output terminal is loaded in a page buffer. Whether the programming data is a specific bit string is detected. When it is detected that the programming data is not a specific bit string, the programming data kept by the page buffer is transferred to an error checking correction (ECC) circuit, and an ECC code generated by an ECC operation is written to the page buffer. On the other hand, when it is detected that the programming data is a specific bit string, transfer of the programming data kept by the page buffer is forbidden, and a known ECC code corresponding to the specific bit string is written to the page buffer.

According to the invention, in the case where the data inputted to the data keeping element is a specific bit string, the data is forbidden from being transferred from the data keeping element to the ECC element, and the ECC code is written to the data keeping element with no operation being performed by the ECC element. Accordingly, time for transferring the data from the data keeping element to the ECC element is reduced, thereby shortening data programming time with respect to the memory array.

DESCRIPTION OF DISCLOSED EMBODIMENTS

Next, the embodiments of the invention are described in detail with reference to the accompany drawings. Here, the embodiments are exemplified by a NAND flash memory. In addition, it is to be noted that the accompany drawings emphasize respective portions for easy understanding, and thus the scales of the drawings are not the same as those of actual devices.

Embodiments

Figure 1:
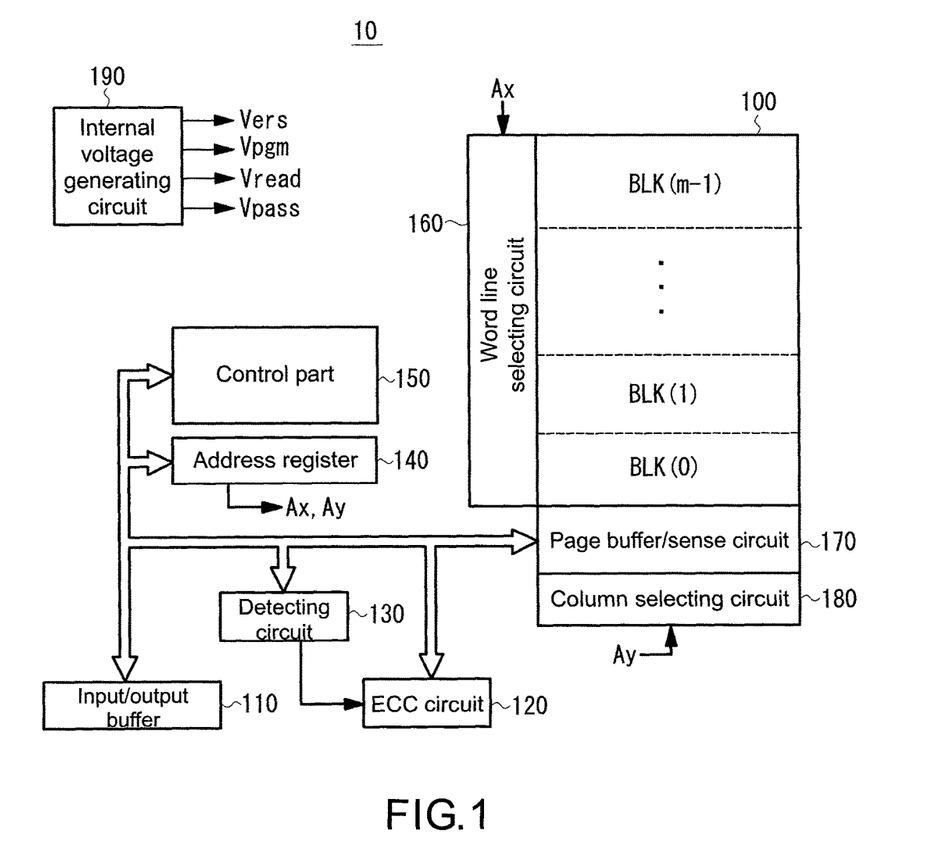
FIG. 1 illustrates a schematic entire configuration of a NAND flash memory according to embodiments of the invention.

A typical configuration of a flash memory according to the embodiments of the invention is shown in FIG. 1. However, the configuration of the flash memory shown herein is only for exemplary purposes, and the invention is not limited to such configuration. A flash memory 10 of the present embodiment includes: a memory array 100, having a plurality of memory cells arranged in matrix; an input/output buffer 110, connected to an external input/output terminal and keeping input/output data; an ECC circuit 120, performing error checking and correction of data programmed in the memory array 100 or data read from the memory array 100; a detecting circuit 130, monitoring data inputted from the external input/output terminal or the input/output buffer 110 to a page buffer/sense circuit 170 and detecting a specific bit string among the data; an address register 140, receiving address data from the input/output buffer 110; a control part 150, receiving command data from the input/output buffer 110 or a control signal from outside so as to control each portion; a word line selecting circuit 160, receiving row address information Ax from the address register 140, decoding the row address information Ax and performing selection of blocks, selection of word lines and so on based on a result of the decoding; the page buffer/sense circuit 170, keeping data read from a page selected by the word line selecting circuit 160 or keeping data written to the selected page; a column selecting circuit 180, receiving column address information Ay from the address register 140, decoding the column address information Ay and performing selection of the data in the page buffer/sense circuit 170 and so on based on a result of the decoding; and an internal voltage generating circuit 190, generating various voltages (write voltage Vpgm, pass voltage Vpass, read pass voltage Vread, erase voltage Vers, etc.) required for data reading, data programming, data erasing and so on.

The memory array 100 includes m memory blocks disposed along a column direction which are referred to as BLK (0), BLK (1) . . . , and BLK (m−1). The page buffer/sense circuit 170 is disposed adjacent to the block BLK (0). In addition to such configuration, the page buffer/sense circuit 170 may also be disposed at another end or at both ends of the memory array 100.

Figure 2:
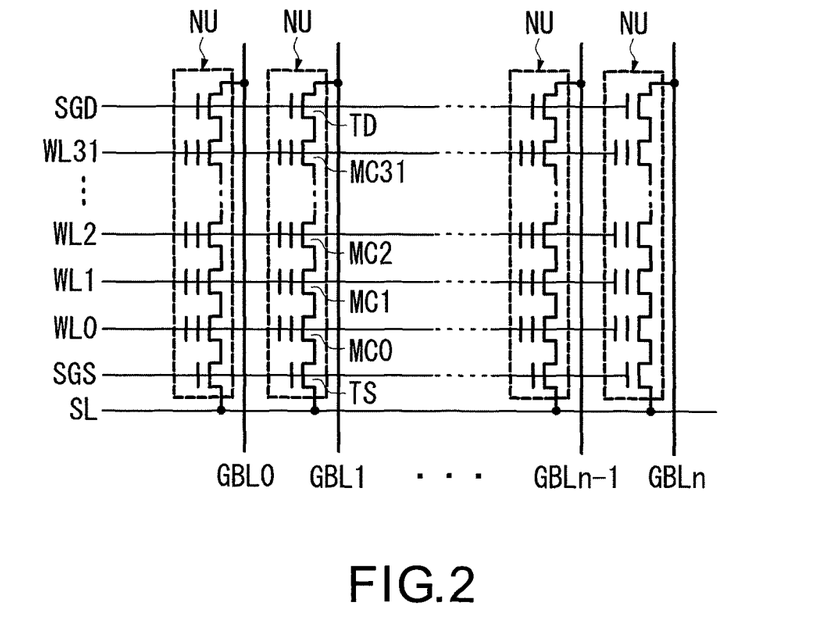
FIG. 2 is a circuit diagram illustrating a configuration of a NAND string of a memory cell array according to the embodiments of the invention.

As shown in FIG. 2, a plurality of NAND cell units NU connecting a plurality of memory cells in series are formed in a memory block, and (n+1) cell units NU are arranged along a row direction in a memory block. The cell unit NU includes: a plurality of memory cells MCi (i=0, 1 . . . , and 31) connected in series; a select transistor TD connected to a drain side of the memory cell MC31 as one end; and a select transistor TS connected to a source side of the memory cell MC0 as another end. Moreover, a drain of the select transistor TD is connected to a corresponding bit line GBL, and a source of the select transistor TS is connected to a common source line SL.

Control gates of the memory cells MCi are connected to word lines WLi. Gates of the select transistors TD and TS are connected to select gate lines SGD and SGS parallel to the word lines WLi. When the word line selecting circuit 160 selects a block based on the row address Ax or an address obtained by conversion, the word line selecting circuit 160 selectively drives the select transistors TD and TS through the select gate lines SGD and SGS for blocks. FIG. 2 illustrates the configuration of a typical cell unit. However, in the cell unit, one or more dummy cells may be included in the NAND string.

Typically, the memory cell has a metal oxide semiconductor (MOS) structure, the MOS structure including: source/drain formed within a P-type well and used as an N-type diffusion region; a tunnel oxide film, formed on a channel between the source and the drain; a floating gate (charge accumulation layer), formed on the tunnel oxide film; and a control gate, formed on the floating gate with a dielectric film therebetween. When no charge is accumulated in the floating gate, namely, when data "1" is written, a threshold is in a negative state and the memory cell is normally on. When electrons are accumulated in the floating gate, namely, when data "0" is written, the threshold is shifted to positive and the memory cell is normally off. However, the memory cell may be a single level cell (SLC) for storing one bit (of binary data), or a multi level cell (MLC) for storing multiple bits.

Table 1 is a table showing an example of a bias voltage applied during various operations of a flash memory. During a reading operation, a certain positive voltage is applied to a bit line, a certain voltage Vx (e.g. 0 V) is applied to a selected word line, the pass voltage Vpass (e.g. 4.5 V) is applied to an unselected word line, a positive voltage (e.g.

4.5 V) is applied to the select gate lines SGD and SGS, the bit line select transistor TD and the source line select transistor TS are switched on, and 0 V is applied to the common source line. During a programming (writing) operation, a high-voltage programming voltage Vpgm (15 to 20 V) is applied to the selected word line, an intermediate potential (e.g. 10 V) is applied to the unselected word line, the bit line select transistor TD is switched on while the source line select transistor TS is switched off, and a potential corresponding to the data "0" or "1" is supplied to the bit line GBL. During an erasing operation, 0 V is applied to the selected word line within the block, and a high voltage (e.g. 20 V) is applied to the P-type well. Accordingly, by drawing the electrons in the floating gate to a substrate, data erasing is performed in units of blocks.

TABLE 1

|  | Erasing | Writing | Reading |
| --- | --- | --- | --- |
| Selected word line | 0 V | 15 V~20 V | Vx |
| Unselected word line | Floating | 10 V | 4.5 V |
| SGD | Floating | Vcc | 4.5 V |
| SGS | Floating | 0 V | 4.5 V |
| SL | Floating | Vcc | 0 V |
| P-type well | 20 V | 0 V | 0 V |

Figure 3:
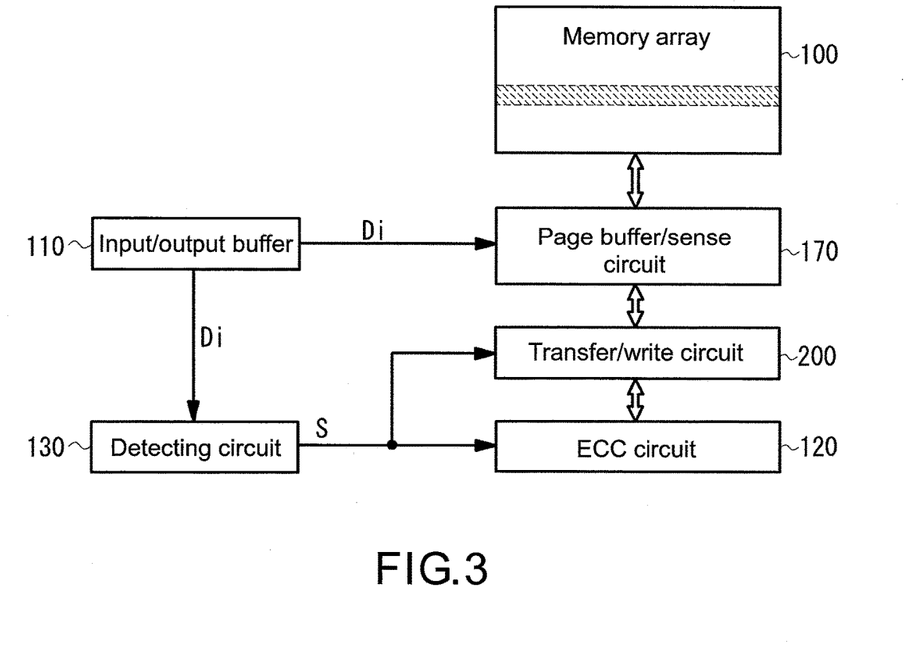
FIG. 3 illustrates a flow of data inputted to a flash memory according to the embodiments of the invention.

FIG. 3 illustrates a flow of data inputted from the external input/output terminal of the flash memory 10 according to the present embodiment. An input data Di provided from the input/output buffer 110 is loaded to the page buffer/sense circuit 170 and concurrently inputted to the detecting circuit 130. The detecting circuit 130 detects whether the input data Di is data containing a specific bit string. The so-called specific bit string refers to a bit string on which the ECC operation is not required, or a bit string for which the ECC code is known. In an example, the detecting circuit 130 detects a bit string in which the input data Di is all "0", or a bit string in which the input data Di is all "1."

Figure 4:
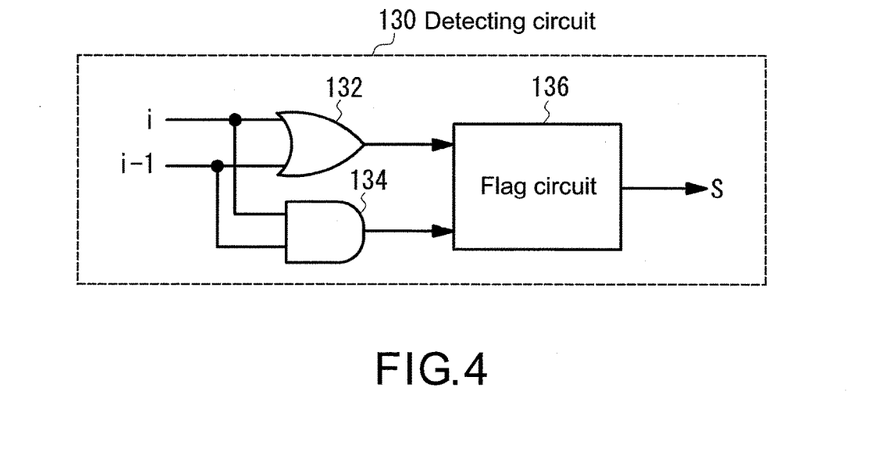
FIG. 4 illustrates an example of a detecting circuit according to the present embodiment.

The detecting circuit 130 detects a specific bit string of the input data Di by means of a logic circuit. FIG. 4 illustrates an example of a detecting circuit detecting that the bit string of the input data Di is all "0" or "1." The detecting circuit 130 includes: a two-input OR circuit 132 and a two-input AND circuit 134, inputting the i-th and (i−1)-th data (wherein i is an integer greater than or equal to 2) of the input data Di, and a flag circuit 136, setting flag information based on an output of these logic circuits. When the input data Di is all "0," the output of the OR circuit 132 is at an L level; otherwise, it is at an H level. In addition, when the input data Di is all "1," the output of the AND circuit 134 is at the H level; otherwise, it is at the L level. The flag circuit 136 outputs a detecting signal S capable of determining that the input data Di is all "0" and all "1." For example, the detecting signal S includes 2-bit data; when it is "00," the input data Di is all "0," and when it is "11," the input data Di is all "1." The detecting signal S of the detecting circuit 130 is provided to a transfer/write circuit 200 and the ECC circuit 120.

The ECC circuit 120 generates the ECC code or a parity bit required for error checking and correction of the input data Di by performing operations on the input data Di. The ECC operations are performed by a well-known method, such as by using hamming codes or Reed-Solomon codes, and then by converting k bits or k bytes of the input data Di into "p=k+q." In this specification, "q" is referred to as the ECC code or the parity bit required for error checking and correction of the input data Di.

The transfer/write circuit 200 is disposed between the page buffer/sense circuit 170 and the ECC circuit 120. The transfer/write circuit 200 transfers the input data Di kept by the page buffer/sense circuit 170 to the ECC circuit 120. Moreover, the transfer/write circuit 200 writes the ECC code generated by the ECC circuit 120 to a spare region of the page buffer/sense circuit 170.

When the detecting circuit 130 detects that the input data Di is a specific bit string, the transfer/write circuit 200 forbids transfer of the input data Di kept by the page buffer/sense circuit 170. That is to say, the ECC circuit 120 does not perform any ECC operation on the input data Di. Instead, the ECC circuit 120 generates the known ECC code for the input data Di (i.e. the specific bit string) and provides it to the transfer/write circuit 200. The transfer/write circuit 200 writes the received known ECC code to the spare region of the page buffer/sense circuit 170.

In an example, the ECC circuit 120 contains a table that specifies a relationship between specific bit strings and known ECC codes. Table 2 is an example of the table that specifies the relationship between specific bit strings and known ECC codes. After receiving the detecting signal S from the detecting circuit 130, the ECC circuit 120 reads the known ECC code corresponding to the specific bit string based on the detecting signal S, and outputs it to the transfer/write circuit 200. For example, when the input data Di is all "0" (in this example, the detecting signal S is "00"), a known ECC code EC0 is outputted to the transfer/write circuit 200. When the input data Di is all "1" (in this example, the detecting signal S is "11"), a known ECC code EC1 is outputted to the transfer/write circuit 200. Such table is not necessarily kept by the ECC circuit 120, and may also be kept by the transfer/write circuit 200. Or, it may be that the detecting circuit 130 keeps the table and provides the known ECC code to the transfer/write circuit 200.

TABLE 2

| Specific bit string | Known ECC code |
| --- | --- |
| All "0" (all 00h) | EC0 |
| All "1" (all FFh) | EC1 |
| ... | ... |

In another embodiment of the invention, the ECC circuit 120 also includes a logic circuit generating the known ECC code based on the detecting signal S. For example, when the detecting signal S is "00," the ECC code EC0 is generated, and when the detecting signal S is "11," the ECC code EC1 is generated. These ECC codes are outputted to the transfer/write circuit 200. Such logic circuit for generating the ECC code is not necessarily included in the ECC circuit 120, and may also be included in the transfer/write circuit 200 or in the detecting circuit 130.

Once the transfer/write circuit 200 completes the writing of the ECC code to the page buffer/sense circuit 170, the input data Di and the ECC code kept by the page buffer/sense circuit 170 are programmed in a selected page of the memory array 100.

During a reading operation, the data read from the selected page of the memory array 100 is kept by the page buffer/sense circuit 170, and then transferred to the ECC circuit 120 through the transfer/write circuit 200. The ECC circuit 120 determines whether there is any programming failure or reading failure based on the ECC code, and corrects the data using the ECC code if there is an error caused by the failure. The ECC-processed data is transferred to the page buffer/sense circuit 170 through the transfer/write circuit 200, and then outputted outside through the input/output buffer 110.

In the present embodiment, if it is that the detecting circuit 130 detects that the input data Di is a specific bit string, the transfer of the input data Di kept by the page buffer/sense circuit 170 to the ECC circuit 120 is omitted, and the known ECC code is written to the page buffer/sense circuit 170 with no operation being performed by the ECC circuit 120. Accordingly, time for transferring the input data Di from the page buffer/sense circuit 170 to the ECC circuit 120 and time for performing ECC operations are reduced, thereby considerably shortening time required for programming the input data Di.

Figure 5:
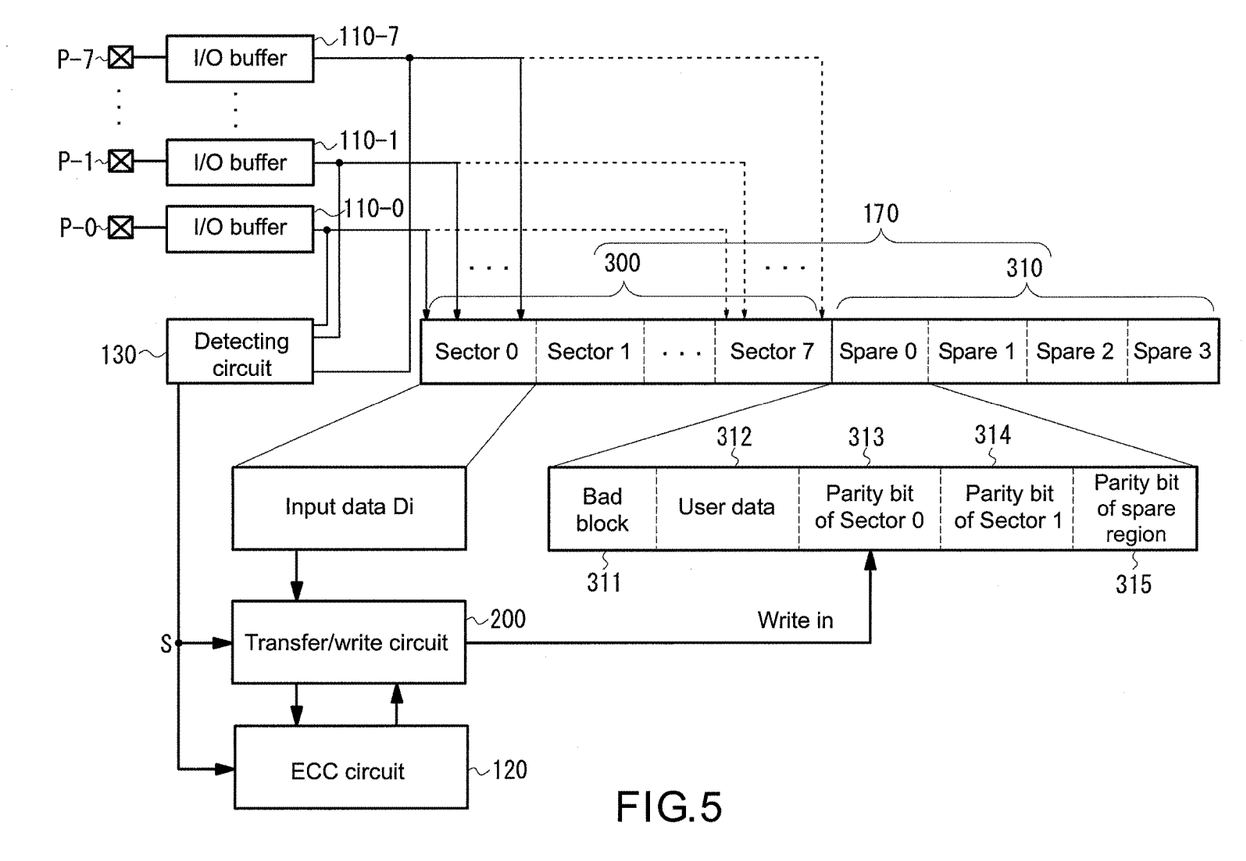
FIG. 5 illustrates a common ECC process according to the embodiments of the invention.

Next, the other embodiments are described with reference to FIG. 5 to FIG. 8. The external input/output terminal of the flash memory 10 is available in configurations such as ×1, ×4, ×8 and so on. Here, an exemplary example is shown in which the flash memory 10 has ×8 external input/output terminals. As shown in FIG. 5, external input/output terminals P-0 to P-7 are connected respectively to input/output (I/O) buffers 110-1 to 110-7, and the data inputted to the external input/output terminals P-0 to P-7 are inputted in parallel to the I/O buffers 110-1 to 110-7. The page buffer/sense circuit 170 includes: a regular region 300 divided into eight sectors including sector 0 to sector 7, and a spare region 310 divided into four sectors including spare 0, spare 1, spare 2 and spare 3.

One sector of the regular region 300 of the page buffer/sense circuit 170 is assigned the eight external input/output terminals P-0 to P-7, i.e. the I/O buffers 110-1 to 110-7. The column selecting circuit 180 shown in FIG. 1 decodes the received column address information Ay, and, based on a result of the decoding, selects a sector to which the data inputted to the external input/output terminals P-0 to P-7 is loaded. In the example shown in FIG. 5, the data received by the external input/output terminals P-0 to P-7 is loaded to the sector 0 according to the column address information Ay. In the example shown in FIG. 6, the data received by the external input/output terminals P-0 to P-7 is loaded to the sector 1 according to the column address information Ay. Meanwhile, the data loaded to each sector is inputted to the detecting circuit 130, and the inputted data is monitored in the detecting circuit 130 to determine whether it is a specific bit string.

One sector of the regular region 300 includes, for example, 256 bytes, and one external input/output terminal is assigned 256 bits (256 bits×8=1 sector). Moreover, in such case, the eight sectors overall keep approximately 2 k bytes of programming data. One sector of the spare region 310 includes, for example, 16 bytes. In such case, the four sectors (spare 0 to spare 3) overall keep 64 bytes of data. One sector of the spare region 310 includes: a region 311, storing information for identifying a bad block containing a defective memory element; a region 312, storing information related to user data; regions 313 and 314, storing the ECC codes (parity bits) with respect to two sectors of the regular region 300; and a region 315, storing the ECC code (parity bit) during an ECC operation performed by the spare region 310. The regions 313 and 314 of the spare 0 of the spare region 310 respectively store the ECC codes (parity bits) of the sector 0 and the sector 1 of the regular region 300. The regions 313 and 314 of the spare 1 of the spare region 310 respectively store the ECC codes (parity bits) of the sector 2 and the sector 3 of the regular region 300. Similarly, the spare 2 of the spare region 310 stores the ECC codes (parity bits) of the sector 4 and the sector 5 of the regular region 300. The spare 3 of the spare region 310 stores the ECC codes (parity bits) of the sector 6 and the sector 7 of the regular region 300.

The transfer/write circuit 200 transfers the data kept in the regular region 300 in units of sectors. That is to say, when one sector has 256 bytes, the transfer/write circuit 200 includes a plurality of transistors for transfer configured to transfer 256 bytes of data to the ECC circuit 120 in parallel. Gates of the transistors for transfer are connected in common to a control signal, and the control signal is controlled by the control part 150. The ECC circuit 120 receives the data transferred in units of sectors, and generates the ECC code by performing the ECC operation. The transfer/write circuit 200 writes the ECC code received from the ECC circuit 120 to the region 313 or 314 of the corresponding sector of the spare region 310.

The exemplary example shown in FIG. 5 is an exemplary example of loading the input data Di, i.e. the programming data, to the sector 0 of the regular region 300. Here, since the input data Di is not a specific bit string, the detecting signal S of the detecting circuit 130 does not forbid the transfer of the transfer/write circuit 200. Accordingly, the transfer/write circuit 200 transfers the input data Di to the ECC circuit 120, and writes the ECC code generated by the ECC circuit 120 to the region 313 of spare 0 of the spare region 310.

Figure 6:
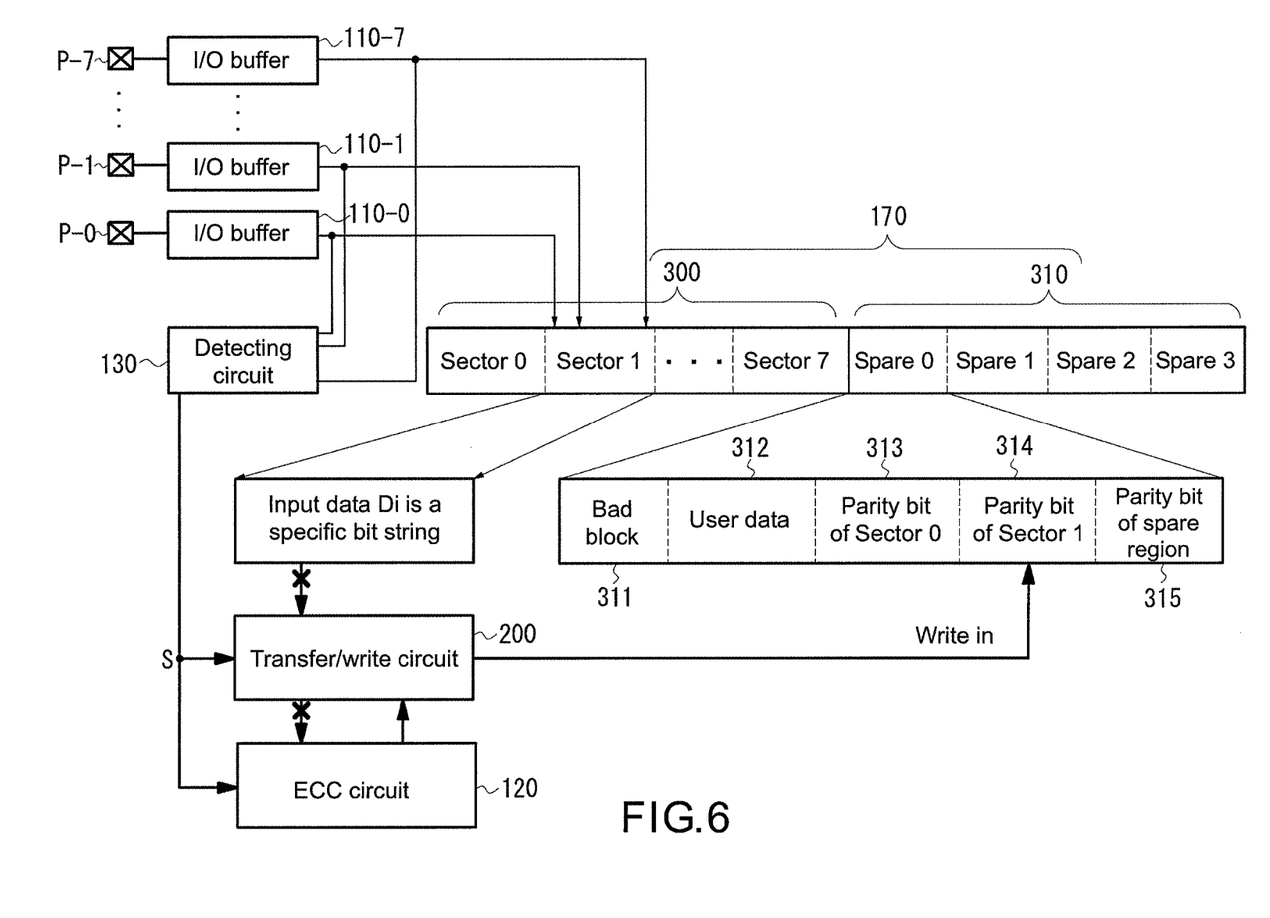
FIG. 6 illustrates an exemplary example in which the ECC process according to the embodiments of the invention is skipped.

FIG. 6 shows actions when the input data Di contains a specific bit string. If the detecting circuit 130 detects that the input data Di loaded to the sector 1 of the regular region 300 is a specific bit string, the detecting signal S is provided to the transfer/write circuit 200 and the ECC circuit 120. In response to the detecting signal S, the transfer/write circuit 200 forbids the transfer of the input data Di of the sector 1 to the ECC circuit 120. In addition, based on the detecting signal S, the ECC circuit 120 identifies the specific bit string and provides the ECC code corresponding to the specific bit string to the transfer/write circuit 200. Next, the transfer/write circuit 200 writes the ECC code of the sector 1 to the region 314 of the spare 0 of the spare region 310.

Figure 7:
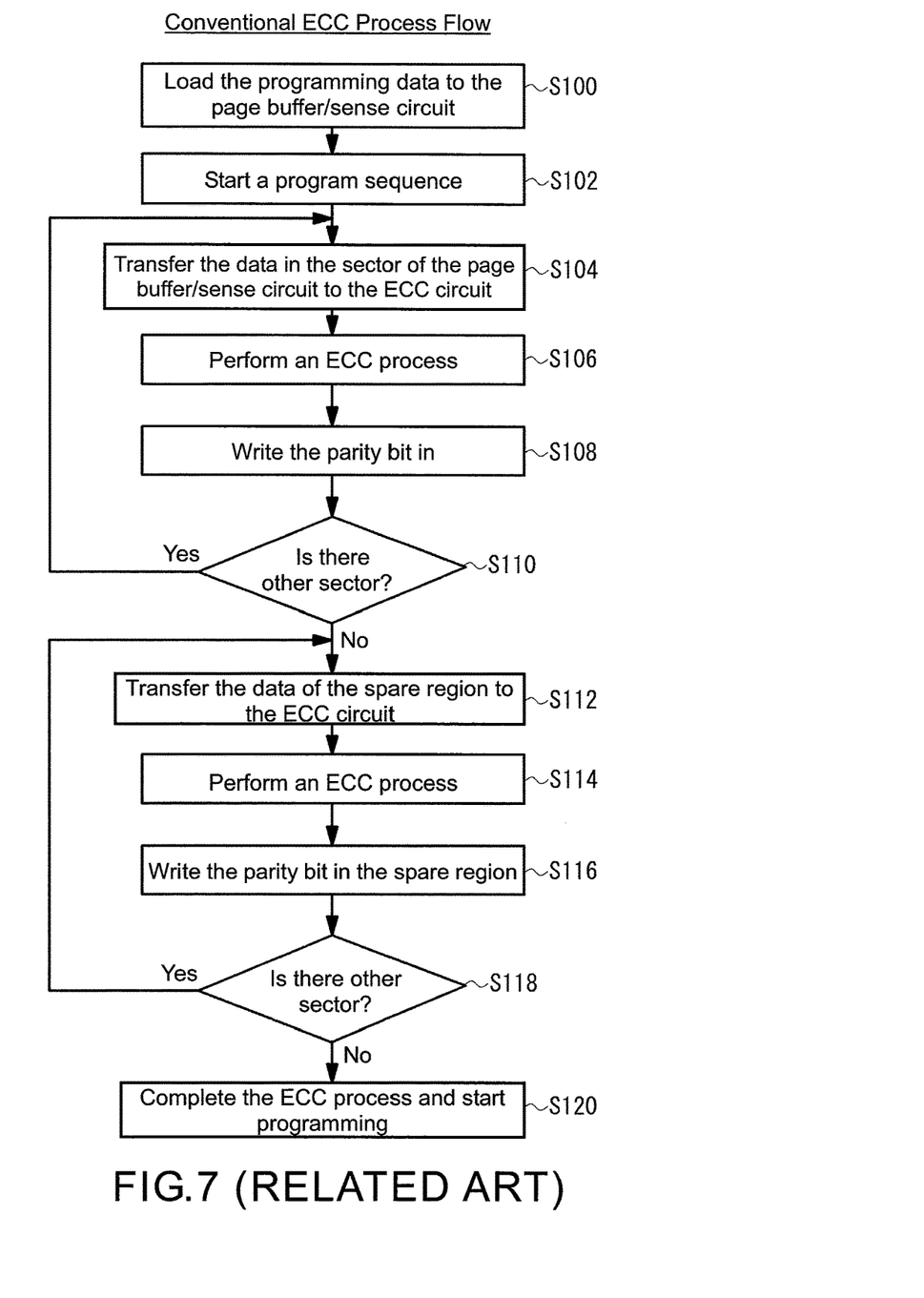
FIG. 7 is a flowchart of an ECC process of a conventional flash memory.
Figure 8:
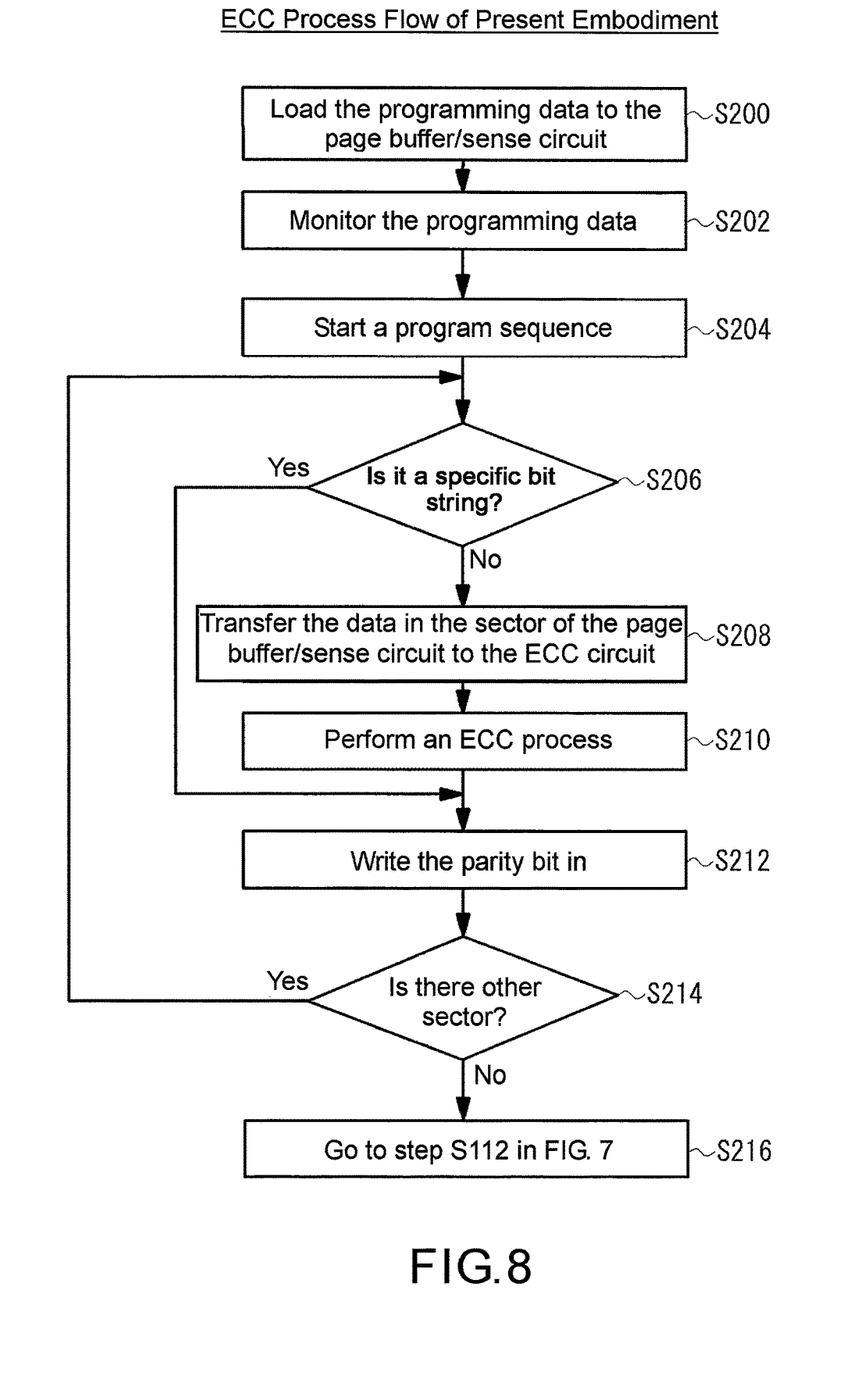
FIG. 8 is a flowchart of an ECC process of the flash memory according to the embodiments of the invention

FIG. 7 illustrates a conventional ECC process flow; FIG. 8 illustrates an ECC process flow according to the present embodiment. First, conventional ECC processing actions are described. An external control signal, command data, address data and programming data are supplied from an external controller to the flash memory 10. The control part 150 starts a programming action based on the external control signal and the command data.

After the programming data (input data Di) is loaded to the page buffer/sense circuit 170 through the external input/output terminal and the input/output buffer 110 (S100), a program sequence is started under control of the control part 150 (S102). The data kept in the sector 0 of the page buffer/sense circuit 170 is transferred to the ECC circuit 120 through the transfer/write circuit 200 (S104). Next, an ECC process is performed in the ECC circuit 120, and the parity bit generated by the ECC circuit 120 is written to the spare region 310 of the page buffer/sense circuit 170 (S108).

Next, the control part 150 or the transfer/write circuit 200 determines whether there is any sector that has not been processed by the ECC process (S110). In this manner, the data of all the sectors of the page buffer/sense circuit 170 is subjected to the ECC process, and the parity bit of each sector is written to the regions 313 and 314 of the corresponding sector of the spare region 310. In addition, although the programming is performed in units of pages in the NAND flash memory, a size of the inputted programming data is not necessarily equal to that of a page, i.e. the eight sectors of the regular region 300 shown in FIG. 5. For example, the size of the programming data may be the size of one sector. Generally, in terms of program disturb, there is limitation on an NOP (number of program) that indicates a number of times allowable for continuously programming in the same page. According to the NOP, a page data is divided and then programmed. When the NOP is 4, a page data is inputted to the flash memory 10 in, for example, two sectors, one sector, three sectors and two sectors.

When the ECC process of the regular region is completed, the ECC process of the spare region is then performed. As shown in FIG. 5, the data of the spare 0 of the spare region 310 is transferred to the ECC circuit 120 by the transfer/write circuit 200 (S112), the ECC process is performed in the ECC circuit 120 (S114), and the generated parity bit is written to the region 315 (S116). Whether there is any sector that has not been processed by ECC process is determined (S118), and if there is such sector, steps S112 to S116 are repeated. In this manner, the ECC process is performed on all the sectors of the spare region 310. When the ECC process on all the data kept in the regular region 300 and the spare region 310 of the page buffer/sense circuit 170 is completed, the data kept by the page buffer/sense circuit 170 is programmed in the selected page of the memory array (S120).

On the other hand, in the flash memory 10 of the present embodiment, the programming data is loaded to the page buffer/sense circuit 170 as shown in FIG. 8 (S200), and in parallel thereto, the programming data is monitored by the detecting circuit 130 (S202). When the loading of the programming data to the page buffer/sense circuit 170 is completed, a program sequence is started (S204).

While the programming data of each sector is inputted to the page buffer/sense circuit 170, the detecting circuit 130 immediately detects whether the programming data of the each sector is a specific bit string (S206). If the programming data of the sector does not match any specific bit string, as conventionally, the programming data of the sector is transferred to the ECC circuit 120 to be subjected to the ECC process (S208 and S210). That is to say, the ECC process shown in FIG. 5 is performed. On the other hand, when the detecting circuit 130 detects that the programming data of the sector matches a specific bit string, the transfer/write circuit 200 does not perform the transfer of the programming data of the sector to the ECC circuit 120, and the ECC circuit 120 does not perform the ECC operation for the programming data of the sector. Thus, steps S208 and S210 are skipped. The ECC circuit 120 skips the ECC operation, but instead identifies the specific bit string based on the detecting signal S, and outputs the known parity bit corresponding to the identified specific bit string to the transfer/write circuit 200. Accordingly, the transfer/write circuit 200 writes the known parity bit to the region 313 or 314 of the spare region 310. Such process is performed with respect to all the sectors of the regular region 300 of the page buffer/sense circuit 170 (steps S206 to S214). When the ECC process of the regular region 300 is completed, the ECC process of the spare region 310 is then performed. The ECC process of the spare region 310 is identical to the conventional approach shown in FIG. 7, and descriptions thereof are thus omitted.

In this way, according to the present embodiment, in the case where the programming data of a specific bit string for which the ECC code is known is inputted, since neither transfer of the programming data from the page buffer/sense circuit 170 to the ECC circuit 120 nor ECC operation is performed, the time for programming the inputted data is reduced. Particularly, since the time for data transfer from the page buffer/sense circuit 170 to the ECC circuit 120 is relatively longer, contribution to reduction in programming time is greater.

The embodiments illustrate an exemplary example where the data kept by the page buffer/sense circuit 170 is transferred to the ECC circuit 120. However, the invention is also applicable in a case where the page buffer/sense circuit 170 has a pipeline structure including one or more cache memories. In such case, data transfer between the cache memory and the ECC circuit is skipped.

The embodiments of the invention have been described in detail as above. However, the invention is not limited to specific embodiments, and may be modified or altered within the spirit and scope of the above-described invention.

What is claimed is:

1. A semiconductor memory device, comprising:
a memory array;
a data keeping element, keeping data read from the memory array or keeping data written to the memory array;
an error checking correction (ECC) element, performing error checking and correction of data;
a transferring element, transferring data from the data keeping element to the ECC element;
a writing element, writing an ECC code generated by the ECC element to the data keeping element; and
a detecting circuit, configured to detect a specific bit string existing in data inputted to the data keeping element, wherein the data inputted to the data keeping element is the data read from the memory array and the specific bit string is a number of bits as preset without changing with the data inputted to the data keeping element, wherein a predetermined ECC code corresponding to the specific bit string is produced according to a known relation to the specific string, the predetermined ECC code is not produced by performing an ECC operation on the specific bit string;
wherein when the specific bit string is detected, the transferring element forbids transfer of the current data having the specific bit string to the ECC element, and the writing element directly writes the predetermined ECC code corresponding to the specific bit string to the data keeping element without performing the ECC operation on the specific bit string,
wherein when the specific bit string is not detected, the transferring element remains transfer of the current data to the ECC element.

2. The semiconductor memory device of claim 1, wherein the specific bit string is a bit string in which all bits are logic 0.

3. The semiconductor memory device of claim 1, wherein the specific bit string is a bit string in which all bits are logic 1.

4. The semiconductor memory device of claim 1, wherein the specific bit string has the number of bits equal to a number of bits transferred simultaneously by the transferring element.

5. The semiconductor memory device of claim 1, wherein the data keeping element is divided into a plurality of sectors, the transferring element transfers the data in units of sectors, and the ECC element performs an ECC process in units of sectors.

6. The semiconductor memory device of claim 1, wherein the number of bits of the specific bit string is equal to a number of bits of a page kept by the data keeping element.

7. The semiconductor memory device of claim 1, wherein the semiconductor memory device further comprises a memory element storing a relationship between the specific bit string and the ECC code, and the writing element writes the ECC code for the specific bit string based on a detection result of the detecting circuit.

8. The semiconductor memory device of claim 1, wherein the writing element comprises a logic circuit generating the ECC code for the specific bit string based on a detection result of the detecting circuit, and writes the ECC code generated by the logic circuit.

9. The semiconductor memory device of claim 1, wherein the semiconductor memory device comprises a plurality of external input/output terminals, data inputted from the plurality of external input/output terminals are loaded in parallel to the data keeping element, and the detecting circuit detects whether the data inputted in parallel contains the specific bit string.

10. The semiconductor memory device of claim 1, wherein the memory array is a NAND memory array and the data keeping element comprises a page buffer.

11. A programming method, the programming method being a programming method of a NAND flash memory, wherein the method comprises:
loading programming data inputted from an external input/output terminal to a page buffer,
using a detecting circuit to detect that the programming data is a specific bit string, wherein the specific bit string is a number of bits as preset without changing with the programming data, wherein the specific bit string as successfully detected indicates that the programming data is not operated by an error checking correction (ECC) operation and a known ECC code corresponding to the specific bit string, the specific bit string is directly taken for the programming data, wherein the known ECC code is produced according to a known relation to the specific bit string, the known ECC code is not produced by performing the ECC operation on the specific bit string,
when detecting that the programming data is not the specific bit string, transferring the programming data kept by the page buffer to an ECC circuit, and writing an ECC code generated by the ECC operation to the page buffer, and
when detecting that the programming data is the specific bit string, forbidding transfer of the programming data kept by the page buffer to the ECC circuit, and directly writing the known ECC code corresponding to the specific bit string to the page buffer.

12. The programming method of claim 11, wherein the programming data is a bit string in which all bits are logic 0.

13. The programming method of claim 11, wherein the programming date is a bit string in which all bits are logic 1.

14. A semiconductor memory device, comprising:
a memory array;
a data keeping element, keeping data read from the memory array or keeping data written to the memory array;
an error checking correction (ECC) element, performing error checking and correction of data;
a transferring element, transferring data from the data keeping element to the ECC element;
a writing element, writing an ECC code generated by the ECC element to the data keeping element; and
a detecting circuit, configured to detect a specific bit string existing in data inputted to the data keeping element, wherein the data inputted to the data keeping element is the data written to the memory array and the specific bit string is a number of bits as preset without changing with the data inputted to the data keeping element, wherein the specific bit string as successfully detected indicates that the current data of the data written to the memory array need not to be operated by an ECC operation,
wherein a predetermined ECC code corresponding to the specific bit string is produced according to a known relation to the specific string, the predetermined ECC code is not produced by performing the ECC operation on the specific bit string;
wherein when the specific bit string is detected, the transferring element forbids transfer of the current data having the specific bit string to the ECC element, and the writing element directly writes the predetermined ECC code corresponding to the specific bit string to the data keeping element without performing the ECC operation,
wherein when the specific bit string is not detected, the transferring element remains transfer of the current data to the ECC element.

* * * * *